United States Patent
Hådén et al.

(10) Patent No.: US 9,882,114 B2
(45) Date of Patent: Jan. 30, 2018

(54) DE-ICING ARRANGEMENT AND METHOD FOR DE-ICING A STRUCTURAL ELEMENT

(71) Applicant: SAAB AB, Linköping (SE)

(72) Inventors: Bertil Hådén, Linköping (SE); Mats Bäckström, Linköping (SE)

(73) Assignee: SAAB AB, Linköping (SE)

( * ) Notice: Subject to any disclaimer, the term of this patent is extended or adjusted under 35 U.S.C. 154(b) by 131 days.

(21) Appl. No.: 14/441,017

(22) PCT Filed: Nov. 8, 2012

(86) PCT No.: PCT/SE2012/051211
§ 371 (c)(1),
(2) Date: May 6, 2015

(87) PCT Pub. No.: WO2014/074034
PCT Pub. Date: May 15, 2014

(65) Prior Publication Data
US 2015/0303369 A1 Oct. 22, 2015

(51) Int. Cl.
*B64D 15/12* (2006.01)
*H01L 41/04* (2006.01)
(Continued)

(52) U.S. Cl.
CPC .......... *H01L 41/042* (2013.01); *B64D 15/163* (2013.01); *F03D 80/40* (2016.05)

(58) Field of Classification Search
CPC .... B65D 15/163; B65D 15/12; B64D 15/163; H01L 41/042; F03D 80/40
See application file for complete search history.

(56) References Cited

U.S. PATENT DOCUMENTS 4,895,322 A * 1/1990 Zieve ................ B64D 15/163
244/134 D
5,074,497 A * 12/1991 Phillips, II ........... B64D 15/163
244/134 A
(Continued)

OTHER PUBLICATIONS

PCT/ISA/210—International Search Report—Aug. 30, 2013 (Isssued in Application No. PCT/SE2012/051211).
(Continued)

*Primary Examiner* — Philip J Bonzell
(74) *Attorney, Agent, or Firm* — Venable LLP; Jeffri A. Kaminski

(57) ABSTRACT

A de-icing arrangement and a method for de-icing a structural element. The de-icing arrangement includes at least one electromagnetic actuator, a capacitive storage bank, a control unit arranged to provide an excitation pulse to the at least one electromagnetic actuator, and a charging circuit arranged to charge the capacitive storage bank. The at least one electromagnetic actuator is arranged to expand in at least one direction when fed with the excitation pulse. The at least one electromagnetic actuator is arranged in relation to the structural element so as to apply a mechanical force caused by the expansion on the structural element. The control unit is arranged to control cutoff of current discharge of the capacitive storage bank into the at least one electromagnetic actuator so as to abort the excitation pulse at a predetermined timing after start of the excitation pulse.

14 Claims, 5 Drawing Sheets

(51) Int. Cl.
  *B64D 15/16* (2006.01)
  *F03D 80/40* (2016.01)

(56) References Cited

U.S. PATENT DOCUMENTS

| | | | | |
|---|---|---|---|---|
| 5,143,325 A * | 9/1992 | Zieve | B64D 15/163 | 244/134 D |
| 5,326,051 A * | 7/1994 | Pisarski | B64D 15/163 | 216/13 |
| 5,429,327 A * | 7/1995 | Adams | B64D 15/163 | 244/134 D |
| 5,553,815 A * | 9/1996 | Adams | B64D 15/163 | 244/134 R |
| 5,782,435 A * | 7/1998 | Ingram | B64D 15/163 | 244/134 A |
| 5,904,322 A | 5/1999 | Giamati et al. | | |
| 5,921,502 A * | 7/1999 | Al-Khalil | B64D 15/16 | 244/134 A |
| 6,102,333 A * | 8/2000 | Gerardi | B64D 15/163 | 244/134 A |
| 6,196,500 B1 * | 3/2001 | Al-Khalil | B64D 15/163 | 244/134 B |
| 6,283,411 B1 * | 9/2001 | Giamati | B64D 15/12 | 244/134 A |
| 7,708,227 B2 * | 5/2010 | Al-Khalil | B64D 15/12 | 244/134 A |
| 8,931,740 B2 * | 1/2015 | Nordin | B64C 3/20 | 244/134 D |
| 8,991,763 B2 * | 3/2015 | Guillermond | B64D 15/12 | 219/545 |
| 9,016,633 B2 * | 4/2015 | Asfia | B64D 15/02 | 244/134 R |
| 9,108,735 B2 * | 8/2015 | Olson | B64D 15/163 | |
| 2002/0096515 A1 * | 7/2002 | Petrenko | B60S 1/026 | 219/770 |
| 2005/0035110 A1 * | 2/2005 | Petrenko | A63C 1/30 | 219/482 |
| 2005/0167427 A1 * | 8/2005 | Petrenko | B60S 1/026 | 219/772 |
| 2006/0237415 A1 * | 10/2006 | Choisnet | B64D 15/12 | 219/201 |
| 2007/0170312 A1 * | 7/2007 | Al-Khalil | B64D 15/22 | 244/134 A |
| 2009/0072091 A1 * | 3/2009 | Al-Khalil | B64D 15/22 | 244/134 A |
| 2010/0206990 A1 | 8/2010 | Petrenko | | |
| 2010/0283319 A1 * | 11/2010 | Boudyaf | B64D 15/12 | 307/9.1 |
| 2012/0091276 A1 | 4/2012 | Al-Khalil | | |
| 2013/0001211 A1 * | 1/2013 | Lewis | B64D 15/12 | 219/201 |
| 2013/0032671 A1 * | 2/2013 | Giles | B64D 15/16 | 244/134 R |
| 2013/0228671 A1 * | 9/2013 | Chou | H04N 5/378 | 250/208.1 |
| 2013/0299637 A1 * | 11/2013 | Hoffenberg | B64D 15/163 | 244/134 A |
| 2013/0342129 A1 * | 12/2013 | Vaughan | H02M 1/14 | 315/240 |
| 2014/0049230 A1 * | 2/2014 | Weyh | H02M 7/483 | 323/207 |
| 2014/0070054 A1 * | 3/2014 | Burton | B64D 15/12 | 244/134 D |
| 2014/0191082 A1 * | 7/2014 | Figueroa-Karlstrom | B64D 15/163 | 244/134 A |
| 2014/0252172 A1 * | 9/2014 | Bridgeford | B64D 15/163 | 244/134 A |
| 2014/0252899 A1 * | 9/2014 | Looser | F16C 32/0402 | 310/90.5 |
| 2015/0028826 A1 * | 1/2015 | Davidson | H02M 1/32 | 323/237 |
| 2015/0077069 A2 * | 3/2015 | Weyh | H02M 7/483 | 323/207 |
| 2015/0314879 A1 * | 11/2015 | Haden | B64D 15/163 | 244/134 D |

OTHER PUBLICATIONS

PCT/ISA/237—Written Opinion of the International Searching Authority—Aug. 30, 2013 (Issused in Application No. PCT/SE2012/051211).

PCT/IPEA/409—International Preliminary Report on Patentability—Mar. 6, 2015 (Issused in Application No. PCT/SE2012/051211).

* cited by examiner

Fig. 1
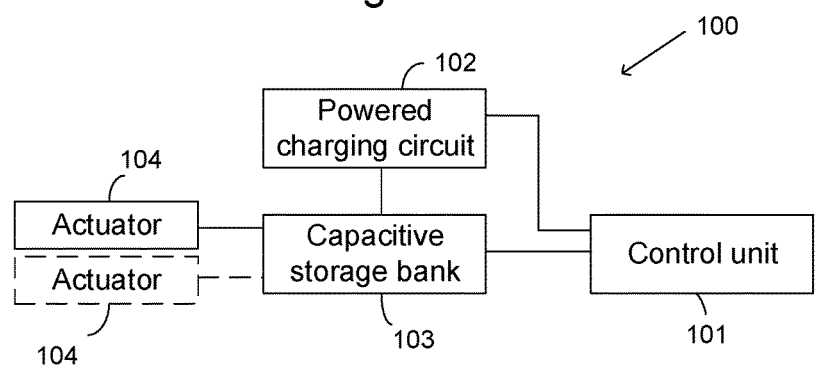
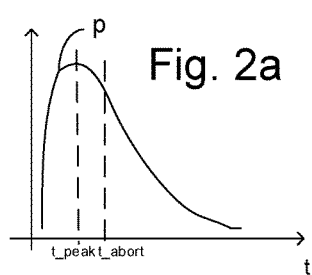
Fig. 2a
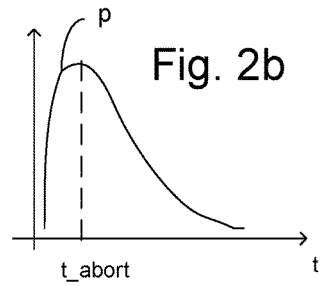
Fig. 2b
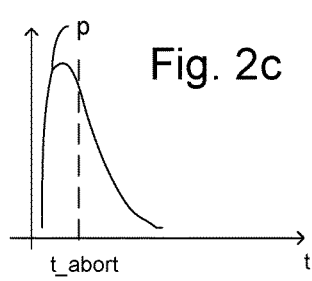
Fig. 2c
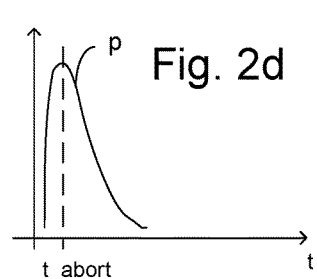
Fig. 2d

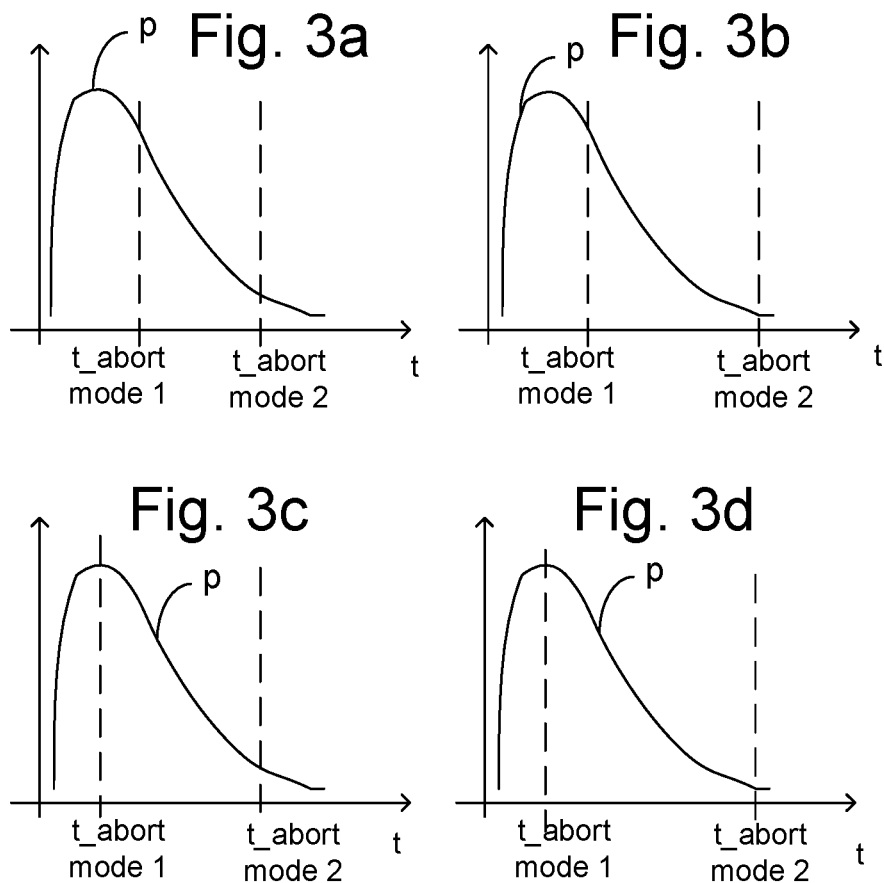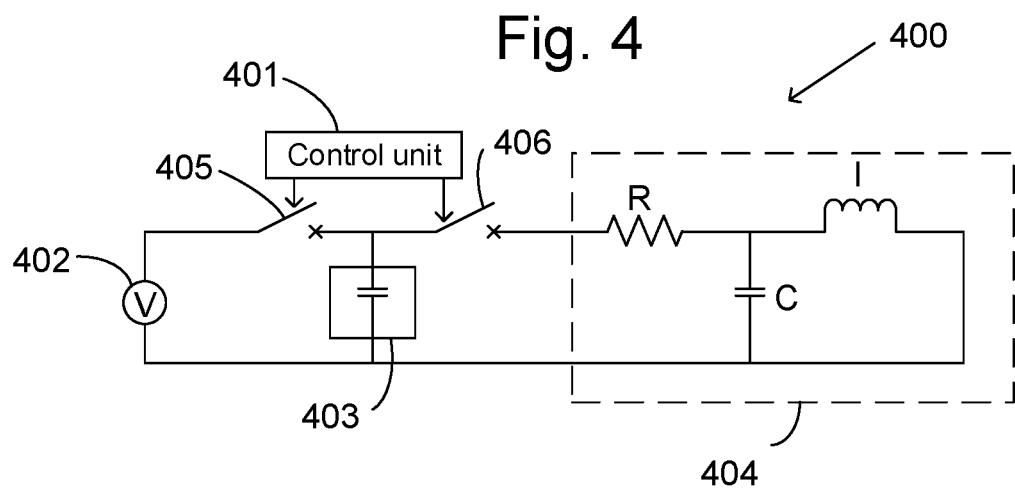

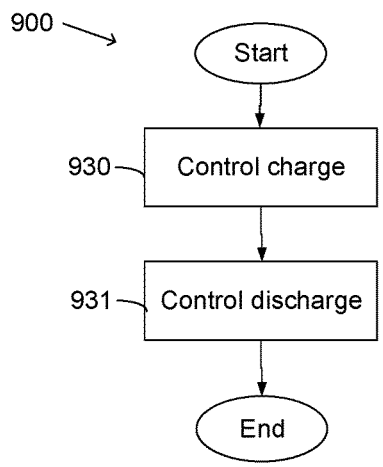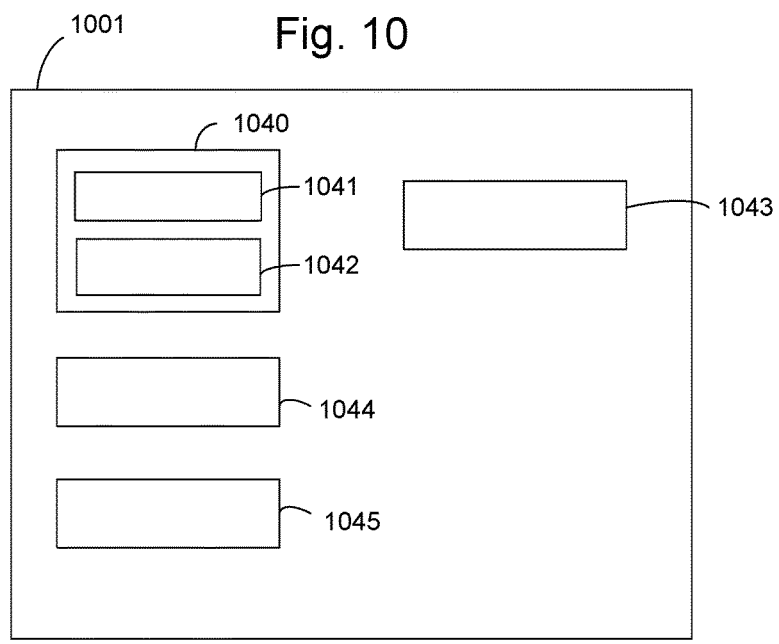

DE-ICING ARRANGEMENT AND METHOD FOR DE-ICING A STRUCTURAL ELEMENT

CROSS-REFERENCE TO RELATED APPLICATIONS

The application is the national phase under 35 U.S.C. § 371 of PCT/SE2012/051211 filed 8 Nov. 2012.

TECHNICAL FIELD

The present invention relates to a de-icing arrangement and method for de-icing a structural element by means of at least one electromagnetic actuator.

BACKGROUND ART

Aircrafts are continuously exposed to varying climatic conditions and in this regard, ice accretion is a threatening event. Ice accretion is known to cause serious perturbations to the flying conditions due to ice formations on aerodynamic surfaces of aircraft.

Ice accretion on aircrafts is a very complex physical process. The selection of an adequate ice rejection technique is thus a difficult task. The technique to be selected must be made compatible with a number of constraints comprising material properties, fatigue, dynamic deformation while in flight, repairing and servicing constraints, durability etc, just to name a few.

One of the issues is the growing need for fuel consumption reductions. Especially when using electromechanical de-icing systems (EMEDS) also the power output for driving the de-icing system is an issue and it is desirable to minimize the peak power output for the electromechanical de-icing system.

Electromechanical de-icing systems use current induced magnetic effects that result either in surface vibrations or strong pulses to effect de-icing.

U.S. Pat. No. 5,782,435 relates to a de-icing system that uses electromagnetic actuators mounted within the airfoil of an aircraft to effect de-icing.

SUMMARY OF THE INVENTION

One objective of the present invention is to provide an improved de-icing of a structural element, such as a wing of an aircraft or a blade of a wind power installation.

This objective has been achieved by means of a de-icing arrangement for de-icing a structural element, said de-icing arrangement comprising:
  at least one electromagnetic actuator,
  a capacitive storage bank,
  a control unit arranged to provide an excitation pulse to the at least one electromagnetic actuator, and
  a charging circuit arranged to charge the capacitive storage bank.

The at least one electromagnetic actuator is arranged to expand in at least one direction when fed with the excitation pulse. The at least one electromagnetic actuator is further arranged in abut relation to said structural element so as to apply a mechanical force on the structural element caused by the expansion. The control unit is arranged to control the current discharge of the capacitive storage bank into the at least one electromagnetic actuator so as to abort the excitation pulse at a predetermined timing after start of the pulse.

With the arrangement above the distribution between generation of mechanical force and heat can be controlled.

Further, with the arrangement above, the power required for each electromagnetic pulse though the structural element can be reduced. Thereby, the use of available power can be optimized to increase the performance of the de-icing.

Further, performance of a platform exposed to harsh weather conditions giving rise to ice accretion, is improved. For example, problems with melted ice flowing over the structural element, which melted ice risks freezing in ice accretion formations on the structural element, can be reduced as heating can be minimized with the selection of the timing of the abortion of the excitation pulse.

The control unit may be arranged to control the current discharge so that the timing of the abortion of the excitation pulse is selected as based on the timing of the completion of the expansion of the at least one electromagnetic actuator. The control unit may be arranged to control the current discharge to abort the excitation pulse at a predetermined timing selected so that there is substantially no reduction in the mechanical force applied on the structural element. The control unit may be arranged to abort the excitation pulse at a predetermined timing based on the time of the peak of the excitation pulse.

In one option, the control unit is arranged to control the predetermined timing for a plurality of consecutive excitation pulses so that the at least one electromagnetic actuator generates a desired distribution between heat and mechanical power. The control unit is for example arranged to control the predetermined timings for abortion of the excitation of the electromagnetic actuator based on at least one of the following parameters: temperature, humidity, ice thickness and ice thickness growth. In detail, in one example, the desired distribution between heat and mechanical power is determined based on at least one of these parameters and the timings are controlled according to the determined distribution of available power between heat and mechanical power. The control unit may be arranged to receive sensor data and/or pre-processed sensor data related to at least one of the parameters above and optionally perform calculations so as to provide at least one of these parameters.

The control unit is in one option arranged to control the charging unit to charge the capacitive storage bank after a predetermined number of excitation pulses.

In one option, the control unit is arranged to operate in at least two modes of operation, wherein in the first mode the excitation pulse is timed to be aborted so that de-icing is performed mainly mechanically by means on the force applied to the structural element. In a second mode of operation the excitation pulse may be timed to be aborted so that de-icing is performed both mechanically and thermally. The thermal de-icing is provided by heating the structural element by means of the electromagnetic actuator. In the first mode of operation, the predetermined time period may be selected to be shorter than in the second mode of operation. In the second mode of operation, the predetermined time period may be selected such that the capacitive storage bank is substantially entirely discharged.

The structural element comprises in one option a base forming a support for the at least one electromagnetic actuator and a flexible skin, wherein the at least one electromagnetic actuator is arranged in relation to the flexible skin so as to apply the force on the flexible skin at the expansion of the electromagnetic actuator.

One embodiment of the present invention relates to a structural element having at least one de-icing arrangement as described above.

Another embodiment of the present invention relates to an aircraft provided with at least one such structural element having at least one de-icing arrangement.

Yet another embodiment of the present invention relates to a wind power turbine provided with at least one such structural element having at least one de-icing arrangement.

Still yet another embodiment of the present invention relates to a method for de-icing a structural element. The method comprises the step of providing an excitation pulse to at least one electromagnetic actuator, whereby the at least one electromagnetic actuator is expanded in at least one direction in response to the received excitation pulse, wherein the at least one electromagnetic actuator is arranged in an abutting relation to said structural element so as to, when expanded, apply a force on the structural element. The providing of an excitation pulse involves controlling current discharge of the capacitive storage bank into the at least one electromagnetic actuator so as to abort the excitation pulse at a predetermined timing after start of the pulse. The method may further comprise a step of controlling charging of the capacitive storage bank by means of a charging circuit.

One embodiment of the invention relates to a computer program comprising a program code for de-icing a structural element, comprising the step of providing an excitation pulse to at least one electromagnetic actuator, whereby the at least one electromagnetic actuator is expanded in at least one direction in response to the received excitation pulse, wherein the at least one electromagnetic actuator is arranged in an abutting relation to said structural element so as to, when expanded, apply a force on the structural element. The providing of an excitation pulse involves controlling current discharge of the capacitive storage bank into the at least one electromagnetic actuator so as to abort the excitation pulse at a predetermined timing after start of the pulse.

One another embodiment of the present invention related to a computer program product comprising a program code stored on a computer readable media for de-icing a structural element, comprising the step of providing an excitation pulse to at least one electromagnetic actuator, whereby the at least one electromagnetic actuator is expanded in at least one direction in response to the received excitation pulse, wherein the at least one electromagnetic actuator is arranged in an abutting relation to said structural element so as to, when expanded, apply a force on the structural element. The providing of an excitation pulse involves controlling current discharge of the capacitive storage bank into the at least one electromagnetic actuator so as to abort the excitation pulse at a predetermined timing after start of the pulse.

BRIEF DESCRIPTION OF THE DRAWINGS

FIG. 1 shows a schematic block scheme of a first example of a de-icing arrangement.

FIGS. 2a-2d show graphs illustrating examples of current curves provided by a capacitive storage bank of the de-icing arrangement of FIG. 1 according to a first example of the invention.

FIGS. 3a-3d show graphs illustrating examples of current curves provided by a capacitive storage bank of the de-icing arrangement of FIG. 1 according to a second example of the invention.

FIG. 4 shows a schematic block scheme of a detailed, second example of a de-icing arrangement.

FIG. 9 is a flow chart illustrating an example of a method for de-icing a structural element.

FIG. 10 shows an example of a control unit of a de-icing arrangement.

DETAILED DESCRIPTION

Figure 5A:
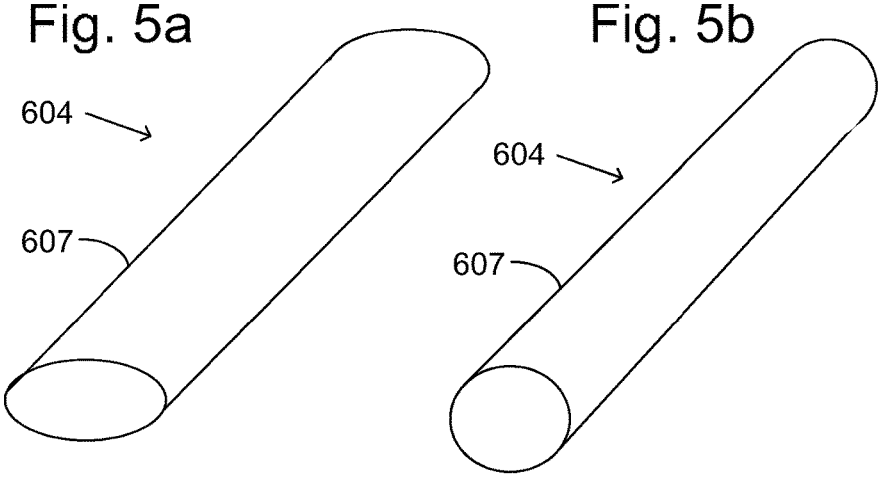
FIGS. 5a and 5b show an example of an electromagnetic actuator in a non-excited state and in an excited state.

A de-icing arrangement for de-icing a structural element comprises at least one actuator for removing ice from the structural element, a capacitive storage bank and a control unit arranged to control discharge of the capacitive storage bank to provide an excitation pulse to the at least one electromagnetic actuator so as to force the actuator to apply a mechanical force on the structural element so as to provide a chock in the structural element. This may result in removal of ice from the structural element. The actuator is arranged to expand in at least one direction when fed with the excitation pulse. The actuator is arranged in relation to the structural element so that mechanical force caused by the expansion on the structural element will be applied to the structure element.

The control unit is arranged to control cutoff of discharge of the capacitive storage bank and thus controlling abortion of the excitation pulse into the at least one electromagnetic actuator.

The energy delivered by the capacitive storage bank is translated into mechanical force and into heat in the actuators. Analysis of test data has indicated that a substantial part of the delivered energy is normally translated into heat. Empirical data shows that the ice is blasted away at an early stage of the discharge process. The ice is blasted away as a result of the operation of the actuator. In detail, the ice may be blasted away as a result of the operation of the actuator mainly caused by the leading edge and the peak of the current curve of the excitation pulse. This impact is obtained from the start of the discharge until about the peak of the pulse. During the reminder of the pulse, mainly all the energy is translated into heat. The heat is heating the structural element.

Accordingly, the tail of the pulse to the actuator can be cut off while still obtaining the same mechanical force on the structure. In some situations, for example at temperatures around zero or a few degrees centigrade, the heating of the structure can even be harmful. The heating may then result in problems with melted ice flowing over the structural element, which melted ice risks freezing in ice accretion formations on the structural element.

Thus, with control of the excitation pulse described above, the mechanical power provided by the arrangement can largely be separated from heat. Therefore the control unit can control the distribution between forming mechanical power and heat. Thus, the distribution between mechanical power and heat for de-icing can be controlled. The benefits from this become even more apparent when de-icing is performed during a time period, wherein a plurality of excitation pulses are controlled during this time period so as to perform the de-icing using a desired distribution between heat and mechanical power.

In practice, it would not be possible to generate only mechanical power and no heat at all. The electromagnetic actuators are generally heated during the time period for performing de-icing and this may be taken into account when controlling the excitation pulses so as to provide the desired distribution between heat and mechanical power. The desired distribution between heat and mechanical power can be adapted to the circumstances, for example weather conditions, ice thickness, ice growth etc, at a particular time.

The actuator is for example an electromagnetic actuator. The circuitry of the actuator has characteristically an ohmic resistance R, an inductance L and a capacitance C. The decay of the reminder of the pulse after the maximum or peak, is then determined by the time constant RC.

Further, a charging circuit may be arranged to charge the capacitive storage bank. When used in a platform having a plurality of de-icing arrangements powered by a plurality of charging circuitries, the power and/or energy output required for powering the de-icing arrangements can be a limiting factor. When cutting off the discharge of the capacitive storage banks before the tail of the pulse, energy may be left in the capacitive storage bank and the charging time can thereby be reduced. This in turn has the effect that the number of mechanical pulses can be increased when there is a limit for the power output. Further the power peak can be decreased or the efficiency of the system can be increased due to the decreased powering of the capacitive storage banks. Further, the energy consumption can also be decreased. The capacitive storage banks may be charged after each excitation pulse or after a plurality of excitation pulses.

In the exemplary embodiment of FIG. 1, a de-icing arrangement 100 comprises at least one electromagnetic actuator 104, a capacitive storage bank 103, a control unit 101 arranged to control discharge of the capacitive storage bank to provide an excitation pulse p to the at least one electromagnetic actuator, and a charging circuit 102 arranged to charge the capacitive storage bank 103. The charging circuit is powered. The charging circuit 102 may be controlled by the control unit 101. The at least one electromagnetic actuator 104 is arranged to expand in at least one direction when fed with the excitation pulse. The at least one electromagnetic actuator 104 is placed in relation to said structural element so as to apply a mechanical force caused by the expansion on the structural element.

The structural element can be used in many applications, aeronautical or not. In one example, the structural element is incorporated in a stationary application.

The control unit 101 is arranged to control discharge of the capacitive storage bank into the at least one electromagnetic actuator so as to abort the excitation pulse at a predetermined timing t_abort after start of the pulse.

As illustrated in the exemplary current pulse curves of FIGS. 2a, 2b, 2c and 2d, the control unit can be arranged to cut off the discharge to abort the excitation pulse (p) at a predetermined time t_abort based on the time of the peak t_peak of the excitation pulse (p). Further, the timing of the cutoff of the discharge is in one example dependent on the decay of the curve. The decay of the curves depends on the size of the capacitor(s) of the capacitive storage bank. FIGS. 2a and 2b illustrate an example wherein the capacitive storage bank comprises larger capacitor(s) than the capacitive storage bank of the FIGS. 2c and 2d. In one example as illustrated in FIGS. 2b and 2d, the timing for cutting off the discharge is selected such that the abortion of the pulse is performed at the current peak of the excitation pulse. In an alternative example, as illustrated in FIGS. 2a and 2c, the predetermined timing for cutting off the discharge is selected so that the excitation pulse p is aborted at timing t_abort when the current has peaked and is starting to decrease. For example the predetermined timing is selected when the current is within the range 70-100% of the peak value, such as 85-90% of the peak value, on the sloping side.

The timing of the cutoff of the discharge can also be illustrated in relation to the operation of the electromagnetic actuator. Accordingly, the control unit 101 can in one example be arranged to control the cutoff of the discharge so that the excitation pulse is aborted based on the expansion of the electro-magnetic actuator. If a minimum of heat is desired, the excitation pulse is aborted as soon as the expansion of the at least one electromagnetic actuator has been completed.

The control unit 101 is in an alternative or complementing example arranged to control the cutoff of the discharge so that substantially no mechanical force is cut away. If little or no heat is desired, the cutoff of the discharge is controlled so that substantially no mechanical force is cut away while at the same time a minimum of heat is generated; thus the timing of the cutoff of the discharge is selected such that substantially no mechanical force is cut away while at the same time the pulse is aborted as soon as possible.

As illustrated in the exemplary current pulse curves of FIGS. 3a, 3b, 3c and 3d, the control unit is in one example arranged to operate in at least two modes of operation. In the first mode, de-icing is performed mainly mechanically as controlled by the excitation pulse. In the second mode of operation, de-icing is performed mechanically and thermally. Thermal de-icing is then provided by heating the structural element by means of the electromagnetic actuator. Accordingly, the predetermined time period before abortion of the excitation pulse in the first mode can be shorter than the predetermined time period in the second mode. In the second mode of operation the predetermined time period may be selected such that the capacitive storage bank is substantially entirely discharged, as illustrated in relation to FIGS. 3b and 3d.

The control unit is in one example arranged to control the electromagnetic actuator based on at least one of the following parameters: temperature, humidity, ice thickness at the structural element and ice thickness growth. The control unit then is arranged to receive sensor data and/or pre-processed sensor data related to at least one of these parameters and optionally perform calculations so as to provide at least one of these parameters. A plurality of modes of operation can be determined based on the at least one parameter: temperature, humidity, ice thickness at the structural element and ice thickness growth. In one example, one mode is determined for each situation.

Further, the control unit may in one example comprise a timing unit arranged to control the timing of the abortion of the excitation pulse based on a preset value for the timing in relation to the start time for the pulse. The preset value is then determined based on analysis of the current pulse curves. Alternatively, the timing of the abortion of the excitation pulse can be determined based on the current amplitude measurements or the like on the excitation pulse and comparison with a preset value for the current at the time of abortion of the pulse. In an example wherein the excitation pulse is under-damped, the excitation pulse can for example be aborted when the current amplitude is equal to zero.

Figure 11A:
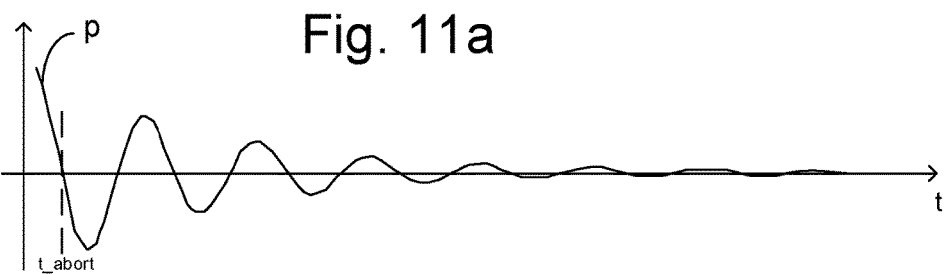
FIGS. 11a-11b show graphs illustrating examples of current curves provided by a capacitive storage bank of the de-icing arrangement of FIG. 1 according to a third example of the invention.
Figure 11B:
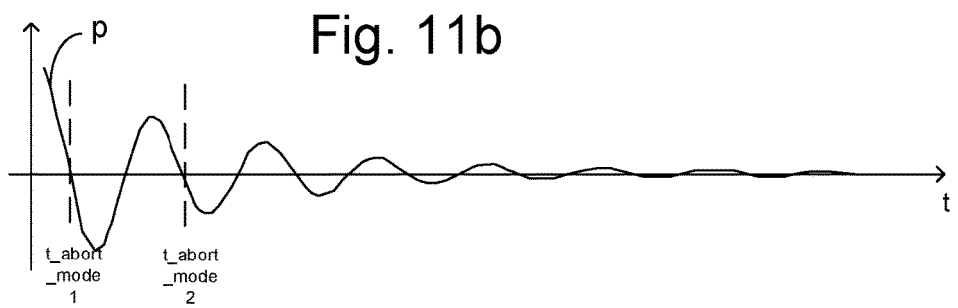

This is illustrated in the exemplary current pulse curves of FIGS. 11a and 11b. In FIG. 11a, the control unit is arranged to cut off the discharge to abort the excitation pulse (p) at a predetermined time t_abort based on the timing of passage of the current amplitude through zero Ampere. In FIG. 11b, the control unit is as arranged to operate in at least two modes of operation, wherein the discharge is cutoff to abort the excitation pulse (p) at a first predetermined time t_abort_mode1 in the first mode and at a second predetermined time t_abort_mode2 in the second mode. This is also described in relation to FIGS. 3a-3d.

In the current curves illustrated in FIGS. 11a and 11b, the capacitance C is reduced in relation to the curves of FIGS. 2 and 3. Thereby, the excitation pulse has an under-damped character. The under-damped curve may be substantially periodic, damped and converge to zero. In this case, it may be beneficial to abort the curve at a zero crossing, when the current changes direction. Thereby, the risk of sparking is minimized since the derivative of the current dI/dt and thus the current induced in a switch or the like used for aborting the pulse, is minimized.

In the example of FIG. 11a, the pulse is aborted at a timing when the current switches direction for the first time. However, this is only an example, the abortion of the pulse may be timed to the second or third or fifth etc time the current switches direction. In yet another, the timing is anywhere along the curve.

In the example of FIG. 11b, the pulse is aborted at the same timing t_abort_mode1 as in FIG. 11a in the first mode of operation and at a different timing t_abort_mode2 in the second mode of operation. The timing in the second mode of operation may be selected so that the excitation pulse is longer than in the first mode. In the illustrated example, the timings substantially coincide with the timings for the change of direction of the current. However, the timings can be selected anywhere along the extension of the pulse.

The control unit is in one example arranged to control the predetermined timing (t_abort, t_abort_mode1, t_abort_mode2) for a plurality of consecutive excitation pulses so that the at least one electromagnetic actuator generates a desired distribution between heat and mechanical power. The desired distribution between heat and mechanical power can be adapted to the circumstances. For example, weather conditions, ice thickness, ice growth etc, at a particular time can be taken into account when determining the desired distribution between heat and mechanical power. Thus, the control unit may be arranged to calculate the desired distribution between heat and mechanical power based on sensor data and/or calculated data. The control unit may further be arranged to determine a desired sequence of excitation pulses and the predetermined timing t_abort associated to each excitation pulse of the pulse train. Thereupon de-icing can be performed based on the predetermined excitation pulse train and the predetermined timings t_abort associated to each excitation pulse of the pulse train.

In one example, the capacitive storage bank is charged between each pulse. In an alternative example, a plurality of pulses are executed between charging by means of the charging circuit.

As it is possible to control the pulses to the actuators and to control the distribution between generating mechanical power, the control unit can be arranged to control the de-icing for optimized use of available power and/or energy, as is clear from above. The benefits from this become especially apparent considering the powering of a system including charging circuits arranged to charge a plurality of capacitive storage banks, wherein each capacitive storage bank in turn may power a plurality of actuators distributed over a platform.

In the exemplary embodiment of FIG. 4 of a de-icing arrangement 400, the de-icing arrangement 400 comprises at least one electromagnetic actuator 404, having an ohmic resistance R, an inductance L and a capacitance C. The de-icing arrangement further comprises a capacitive storage bank 403 and a powered charging circuit 402 arranged to charge the capacitive storage bank 403. A control unit 101 is arranged to control charging of the capacitive storage bank 403 by means of the charging circuitry 402. The control unit 401 is further arranged to control discharge of the capacitive storage bank to provide an excitation pulse to the at least one electromagnetic actuator.

In the illustrated example, the control unit 401 is arranged to control a first switch 405 so that the charging circuit charges the capacitive storage bank when the first switch is closed. When the first switch is open, the capacitive storage bank is not charged. The control unit 401 is further arranged to control a second switch 406 so that the capacitive storage bank is discharged when the second switch 406 is closed. When the second switch 406 is open, the capacitive storage bank is not discharged. The first and second switches 405, 406 are designed to withstand high currents. Further, the first and second switches may be designed with regard to heating and/or sparks. The control unit 401 is not described more in detail here but it operates in an equivalent manner as the control unit 101 described in relation to FIGS. 1, 2, 3, 11 and 12.

The at least one electromagnetic actuator 404 can be formed in many ways known to the person skilled in the art. In one example, the at least one electromagnetic actuator 404 is arranged to expand in at least one direction when fed with the excitation pulse. The at least one electromagnetic actuator 404 is in accordance with this example placed in relation to said structural element so as to apply a mechanical force caused by the expansion on the structural element.

Figure 5B:
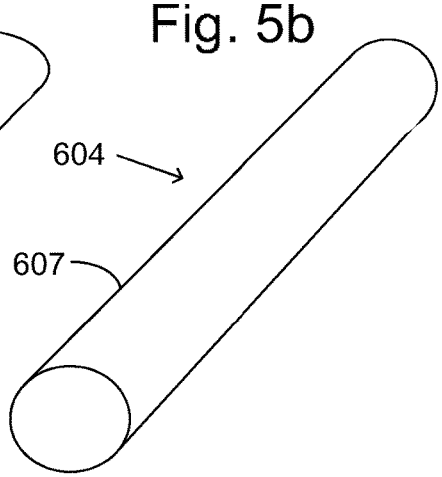

In FIGS. 5a and 5b, electromagnetic actuators 604 are formed as elongated flattened tubes 607 arranged to expand in one direction when fed with current. In FIG. 5a, the actuator 604 is in its normal, flattened, non-current-fed state while in FIG. 5b, the actuator 604 is fed with current. In the illustrated example the elongated tube 607 becomes circular shaped when fed with current. In detail, the actuators 604 have in one example conductive strips fabricated on a flexible dielectric sheet. The dielectric sheet is rolled into the flattened elongated tube 607 such that the conductive strips are wound into coils with the axis of the winding coil coincident to the longitudinal axis of the elongated tube 607. The axis of the coil windings are in one example located substantially parallel to and beneath ice prone surfaces of the structural element. The interaction between the current in the windings of the coil results in an impulse electromagnetic force F or excitation that causes the coil to rapidly expand from its flattered shape to a substantially circular shape. This expansion in turn exerts an impulsive force on the surface of the flexible sheet which then distends and recoils, thereby expelling any ice accretions on the surface thereof. Once actuated the coil returns to its original shape due to the elasticity of the tube and due to the tension exerted inwardly by the flexible sheet.

Figure 6A:
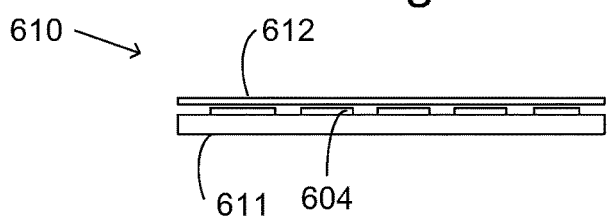
FIGS. 6a and 6b show an example of a structural element with an electromagnetic actuator in a non-excited state and in an excited state.
Figure 6B:
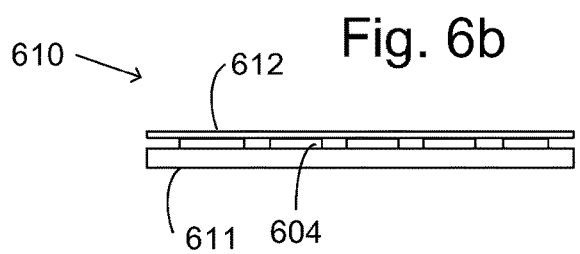

In the exemplary embodiment of FIG. 6, a structure element 610 comprises a support structure 611 holding a plurality of actuators 604 and a flexible sheet 612. In FIG. 6a no current is fed to the actuators. In this state, no force or only a statical force acts on the flexible sheet 612. In FIG.

6b, an excitation pulse has been fed to the actuator. In this state, the actuators apply an impulse force on the flexible sheet 612.

Figure 7:
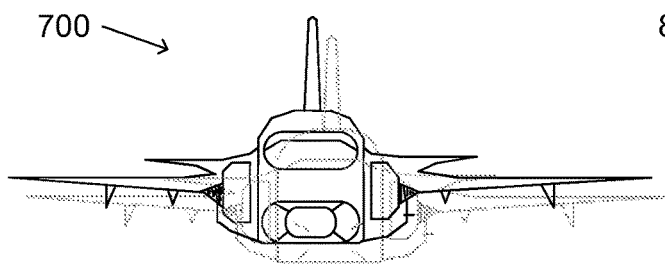
FIG. 7 shows a front view of an aircraft having one or a plurality of de-icing arrangements

In the exemplary embodiment of FIG. 7, a platform in the form of an aircraft 700 comprises at least one structural element arranged with the de-icing arrangement as described above. The construction element comprises in one example a metal such as aluminium or an alloy thereof. In one example, the construction element is a part of a wing or fuselage of an airborne vehicle such as an airplane. Furthermore, the de-icing arrangement could be adapted to curve parts of wings, fuselage, engine air intake or any other point at which ice accretion is formed. Each construction element is provided with one or a plurality of de-icing elements as described above. The aircraft may be a fighter, bomber, surveillance aircraft, or a combination thereof. The aircraft may be engine powered or a glider. The aircraft may be manned or unmanned, e.g. an UAV (Unmanned Aerial Vehicle). The aircraft may be fixed-wing, ornithopter, rotary wing or a combination thereof. The platform may alternatively be a satellite, space-shuttle, rocket or missile.

In the example of FIG. 7 relating the aircraft, the de-icing arrangement(s) is mounted within the airfoil, i.e. the structural element, of an airframe. In using the tube with coil windings as described above, the axis of the coil windings may be located substantially parallel to and beneath ice prone surfaces of an airfoil, such as the leading edges.

Figure 8:
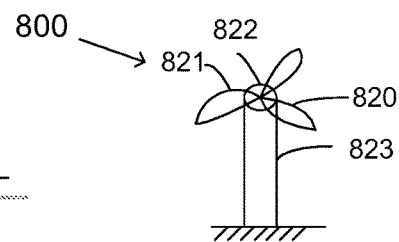
FIG. 8 shows a front view of a wind power plant having one or a plurality of de-icing arrangements.

In the exemplary embodiment of FIG. 8, a platform in the form of a wind power plant 800 comprises at least one structural element arranged with the de-icing arrangement as described above. The wind power plant has a wind turbine 820 having a plurality of blades 821, wherein each of the blades 821 is provided with at least one de-icing arrangement as described above. The blades 821 are arranged to rotate around a hub 822. A base 823 is supporting the wind turbine 820. The wind turbine is in one example mounted on a land based or sea based power plant. Other features, such as generator, gear box and control units are not shown in the figure for reasons of clarity. A rotor diameter of the wind power installation may be up to 120 meters. However, any suitable rotor diameter may be used such as 50 meters or 75 meters. Wind power installations may suffer from ice accretion on e.g. the blades 821. Ice accreted on the blades in general has a negative impact on the performance of the wind power installation.

In a situation where adhered ice is covering at least a part of one blade, shear forces at the hub causes impaired operation and an increased risk of shut down or, in severe cases, a breakdown of the wind power installation. Conventional de-icing systems may require more power than the wind turbine generates. According, during weather conditions wherein ice is formed, power plants are today usually not in service. The de-icing arrangement as described herein would require less power than is produced by the wind turbine on which it is installed. Further, the de-icing events, i.e. the timing of the excitation pulses can be selected so that the ice which comes off due to the force applied to the structural element is falling to the ground within a predetermined zone on the ground.

In FIG. 9, a method for de-icing a structural element comprises the step of providing 931 an excitation pulse to at least one electromagnetic actuator, wherein the at least one electromagnetic actuator is expanded in at least one direction in response to the received excitation pulse and wherein the at least one electromagnetic actuator is arranged in abutting relation to said structural element so as to, when expanded, apply a force on the structural element. The providing of an excitation pulse to at least one electromagnetic actuator comprises controlling current discharge of the capacitive storage bank so as to abort the excitation pulse at a predetermined timing after start of the pulse. The method for de-icing a structural element further comprises a step of controlling 930 charge of the capacitive storage bank.

In FIG. 10 a control unit 1001 is shown arranged to provide control signals for a de-icing arrangement. The control unit 1001 may be a de-icing control unit aboard an aircraft. The control unit 1001 may be a de-icing control unit of a wind power installation. The control unit 1001 comprises a non-volatile memory 1040, a data processing device 1043 and a read/write memory 1044. Non-volatile memory 1040 has a first memory portion 1041 wherein a computer program, such as an operating system, is stored for controlling the function of the control unit. Non-volatile memory 1040 also has a second memory portion 1042 arranged to perform a certain part of the program which is stored in a separate memory 1045, or a certain part of the program which is stored in the read/write memory 1044.

Further, the control unit 1001 comprises a bus controller, a serial communication port, I/O-means, an A/D-converter, a time date entry and transmission unit, an event counter and an interrupt controller (not shown).

The data processing device 1043 may communicate with a data communications port by means of a data bus. The non-volatile memory 1040 is adapted for communication with the data processing device 1043 via a data bus. The separate memory 1045 is adapted for communication with the data processing device 1043 via a data bus. The read/write memory 1044 is adapted for communication with the data processing device via a data bus.

Signals relating to the operation of the de-icing arrangement may be received from the other parts of the control unit, from manual control, from sensors or from other processing units may be stored in the memory 1044 or 1045.

The data processing device 1043 is set up to perform execution of code in a manner described herein. The processing device 1043 is arranged to perform routines so as to de-ice the structural element according to an aspect of the invention.

Parts of the methods described herein can be performed by the apparatus by means of the data processing device 1043 running the program. When the apparatus runs the program, parts of the methods described herein are executed.

The computer program comprises a program code for de-icing a structural element, comprising the step of providing an excitation pulse to at least one electromagnetic actuator, wherein the at least one electromagnetic actuator is expanded in at least one direction in response to the received excitation pulse and wherein the at least one electromagnetic actuator is arranged in abutting relation to said structural element so as to, when expanded, apply a force on the structural element. The providing of an excitation pulse to at least one electromagnetic actuator comprises controlling current discharge of the capacitive storage bank so as to abort the excitation pulse at a predetermined timing after start of the pulse. A computer programme product comprises the program code as described above stored on a computer readable media.

The control unit 1001 may be arranged for communication with a main mission computer of an aircraft or a central monitoring system computer of e.g. a wind power installation.

The invention claimed is:

1. De-icing arrangement for de-icing a structural element, said de-icing arrangement comprising:

at least one electromagnetic actuator,
a capacitive storage bank,
a control unit arranged to provide an excitation pulse to the at least one electromagnetic actuator, and
a charging circuit arranged to charge the capacitive storage bank,
wherein the at least one electromagnetic actuator is arranged to expand in at least one direction when fed with the excitation pulse,
wherein the at least one electromagnetic actuator is placed in relation to said structural element so as to apply a mechanical force caused by the expansion on the structural element, and
wherein the control unit is arranged to control cutoff of current discharge of the capacitive storage bank into the at least one electromagnetic actuator so as to abort the excitation pulse at a predetermined timing after start of the excitation pulse, such that the current discharge of the capacitive storage bank into the at least one electromagnetic actuator generates a desired distribution between heating of the electromagnetic actuator and mechanical power.

2. The de-icing arrangement according to claim 1, wherein the charging circuit is arranged to charge the capacitive storage bank after a predetermined number of excitation pulses.

3. The de-icing arrangement according to claim 1, wherein the structural element comprises a base forming a support for the at least one electromagnetic actuator and a flexible skin, wherein the at least one electromagnetic actuator is arranged in relation to the flexible skin so as to apply the force on the flexible skin at the expansion.

4. The de-icing arrangement according to claim 1, wherein the control unit is arranged to control the predetermined timings for a plurality of consecutive excitation pulses so that the at least one electromagnetic actuator generates a desired distribution between heat and mechanical power.

5. The de-icing arrangement according to claim 4, wherein the control unit is arranged to control the predetermined timings for excitation of the electromagnetic actuator based on at least one of the following parameters: temperature, humidity, ice thickness at the structural element, ice thickness growth, speed and altitude.

6. The de-icing arrangement according to claim 1, wherein the control unit is arranged to operate in at least two modes of operation, wherein in the first mode de-icing is performed mechanically by the excitation pulse and a second mode of operation wherein de-icing is performed mechanically and thermally, wherein in the second mode the structural element is heated by the electromagnetic actuator.

7. The de-icing arrangement according to claim 6, wherein in the first mode the predetermined time period is shorter than in the second mode.

8. The de-icing arrangement according to claim 7, wherein in the second mode of operation the predetermined time period is selected such that the capacitive storage bank is substantially entirely discharged.

9. A structure, comprising
a structural element; and
at least one de-icing arrangement configured to de-ice the structural element, the at least one de-icing arrangement comprising
at least one electromagnetic actuator,
a capacitive storage bank,
a control unit arranged to provide an excitation pulse to the at least one electromagnetic actuator, and
a charging circuit arranged to charge the capacitive storage bank,
wherein the at least one electromagnetic actuator is arranged to expand in at least one direction when fed with the excitation pulse,
wherein the at least one electromagnetic actuator is placed in relation to said structural element so as to apply a mechanical force caused by the expansion on the structural element, and
wherein the control unit is arranged to control cutoff of current discharge of the capacitive storage bank into the at least one electromagnetic actuator so as to abort the excitation pulse at a predetermined timing after start of the excitation pulse, such that the current discharge of the capacitive storage bank into the at least one electromagnetic actuator generates a desired distribution between heating of the electromagnetic actuator and mechanical power.

10. The structural element according to claim 9, wherein the structural element forms part of an aircraft.

11. The structural element according to claim 9, wherein the structural element forms part of a wind power turbine.

12. A method for de-icing a structural element, said method comprising:
providing an excitation pulse to at least one electromagnetic actuator, whereby the at least one electromagnetic actuator is expanded in at least one direction in response to the received excitation pulse, wherein the at least one electromagnetic actuator is arranged in an abutting relation to said structural element so as to, when expanded, apply a force on the structural element,
wherein providing the excitation pulse to at least one electromagnetic actuator comprises controlling cutoff of current discharge of a capacitive storage bank into the at least one electromagnetic actuator so as to abort the excitation pulse at a predetermined timing after start of the pulse, such that the current discharge of the capacitive storage bank into the at least one electromagnetic actuator generates a desired distribution between heating of the electromagnetic actuator and mechanical power.

13. The method for de-icing a structural element according to claim 12, further comprising:
controlling charging of the capacitive storage bank by a charging circuit.

14. A computer program product, comprising:
a non-transitory computer readable medium comprising a program code for carrying out a method for de-icing a structural element, the method comprising
providing an excitation pulse to at least one electromagnetic actuator, whereby the at least one electromagnetic actuator is expanded in at least one direction in response to the received excitation pulse, wherein the at least one electromagnetic actuator is arranged in an abutting relation to said structural element so as to, when expanded, apply a force on the structural element,
wherein providing the excitation pulse to at least one electromagnetic actuator comprises controlling cutoff of current discharge of a capacitive storage bank into the at least one electromagnetic actuator so as to abort the excitation pulse at a predetermined timing after start of the pulse, such that the current discharge of the capacitive storage bank into the at least one electromagnetic actuator generates a desired distribution between heating of the electromagnetic actuator and mechanical power.

* * * * *